ABSTRACT

United States Patent [19]

Takagi et al.

[11] Patent Number: 4,987,108
[45] Date of Patent: Jan. 22, 1991

[54] DIELECTRIC PASTE

[75] Inventors: Hiroshi Takagi, Ohtsu; Yoshiaki Mori, Nagaokakyo; Hiroji Tani, Nagaokakyo; Yukio Sakabe, Kyoto, all of Japan

[73] Assignee: Murata Manufacturing Co., Ltd., Japan

[21] Appl. No.: 169,394

[22] Filed: Mar. 9, 1988

[30] Foreign Application Priority Data

Mar. 11, 1987 [JP] Japan ................................. 62-56204

[51] Int. Cl.$^5$ .............................................. H01B 3/00
[52] U.S. Cl. .................................... 501/138; 501/139; 252/62.3 BT
[58] Field of Search ............................... 501/138, 139; 252/62.3 BT

[56] References Cited

U.S. PATENT DOCUMENTS 4,220,547 9/1980 Abe et al. ............................ 501/139
4,855,266 8/1989 Burn ..................................... 501/138

FOREIGN PATENT DOCUMENTS 59-138003 8/1984 Japan .
2080789 2/1982 United Kingdom .

Primary Examiner—Olik Chaudhuri
Assistant Examiner—Andrew Griffis
Attorney, Agent, or Firm—Ostrolenk, Faber, Gerb & Soffen

[57] ABSTRACT

A dielectric paste for fabrication of multilayer ceramic substrates containing capacitive circuits. The paste comprises a dielectric powder composed of a dielectric material and a vitreous binder suspended in an organic vehicle. The dielectric material consists essentially of a composition expressed by the general formula:

$$\{(Ba_{1-x-y-z}Sr_xCa_yMg_z)O\}_m \cdot (Ti_{1-u}Zr_u)O_2$$

wherein x, y, z, u and m take values within the following respective ranges: $0 \leq x < 0.30$, $0 \leq y < 0.30$, $0 \leq z < 0.05$, $0 \leq u < 0.25$, $1 \leq m < 1.03$, and the vitreous binder consists essentially of a composition expressed by the general formula:

$$\alpha Li_2O \cdot \beta BaO \cdot \gamma B_2O_3 \cdot (1-\alpha-\beta-\gamma)SiO_2$$

wherein $\alpha$, $\beta$ and $\gamma$ are molar ratios of the respective ingredients and take values within the following respective ranges: $0 \leq \alpha < 0.25$, $0.1 \leq \beta < 0.5$, $0.1 < \gamma < 0.5$, and $0.3 < \alpha+\beta+\gamma < 0.8$. The content of the vitreous binder in the dielectric powder ranges from not less than 5 wt % to less than 40 wt %.

8 Claims, No Drawings

DIELECTRIC PASTE

FIELD OF THE INVENTION

This invention relates to dielectric paste and, more particularly, to dielectric paste for fabrication of multilayer ceramic substrates containing capacitive circuits.

DESCRIPTION OF THE PRIOR ART

In order to achieve an increase in packaging density and functions of electronic circuits, there is a strong demand for development of multilayer printed circuit boards containing such passive element networks as inductive circuits, resistive circuits and capacitive circuits.

The known multilayer printed circuit boards containing inductive, capacitive or resistive circuits are produced by first printing an electronic ink in the designed pattern on ceramic green sheets by thick film techniques, stacking them one on another, and then firing the stack to complete multilayer printed circuit boards.

It is, however, impossible with the conventionally used ceramic substrates to fabricate large capacitance, capacitive circuits because of a low dielectric constant (generally, less than 10) of the ceramic substrate. Thus, when the multilayer printed circuit boards are used for electronic circuits, for example, tuner circuits for radio sets which requires a bypass capacitors with a capacitance of 100 pF and above, it is necessary to solder individual capacitors to the multilayer printed circuit boards, thus making it impossible to increase the packaging density of the electronic circuits.

SUMMARY OF THE INVENTION

It is therefore an object of the present invention to provide a capacitive paste which overcomes aforesaid disadvantages and makes it possible to fabricate multilayer ceramic substrates containing large capacitance, capacitive circuits.

According to the present invention, the above object is achieved by proving dielectric paste for forming capacitive circuits on ceramic sheets or substrates for multilayer ceramic boards.

The above and other objects, features and advantages of the present invention will be further apparent from the detailed description given hereinafter. It should be understood, however, that that detailed description and specific examples, while indicating preferred embodiments of the invention, are given by way of illustration only, since various changes and modifications within the spirit and scope of the invention will become apparent to those skilled in the art from this description.

DETAILED DESCRIPTION OF THE INVENTION

According to the present invention there is provided a dielectric paste comprising a dielectric powder composed of a dielectric material and a vitreous binder suspended in an organic vehicle, characterized in that said dielectric material consisting essentially of a composition expressed by the general formula:

$$\{(Ba_{1-x-y-z}Sr_xCa_yMg_z)O\}_m \cdot (Ti_{1-u}Zr_u)O_2$$

wherein x, y, z, u and m take values within the following respective ranges: $0 \leq x < 0.30$, $0 \leq y < 0.30$, $0 \leq z < 0.05$, $0 \leq u < 0.25$, $1 \leq m < 1.03$, said vitreous binder consisting essentially of a composition expressed by the general formula:

$$\alpha Li_2O \cdot \beta BaO \cdot \gamma B_2O_3 \cdot (1-\alpha-\beta-\gamma)SiO_2$$

wherein $\alpha$, $\beta$ and $\gamma$ are molar ratios of the respective ingredient and take values within the following respective ranges: $0 \leq \alpha < 0.25$, $0.1 < \beta < 0.5$, $0.1 < \gamma < 0.5$, $0.3 < \alpha+\beta+\gamma < 0.8$, the content of said vitreous binder in the dielectric powder being not less than 5 wt % to less than 40 wt %.

The above dielectric material which is a main component of the dielectric powder may contain not more than 5% by weight of at least one additive selected from the group consisting of $MnO_2$ and LiF.

The dielectric powder, or solid component in the dielectric paste is mixed with the organic vehicle in any ratio according to demands. Preferably, the weight ratio of the solid component to vehicle ranges from 20:80 to 90:10.

The dielectric material has been limited to those having a composition with values of x, y, z, u and m falling in the above range for the following reasons. If x, y, z and u exceed the respective upper limits, sintering does not take place at 1050° C. and below. If m is less than 1, the specific resistance becomes lowered and less than $10^{12}$ Ω cm. If the value of m is more than 1.03, sintering does not take place at 1050° C. and below. For this reason, m has been limited to a value within the range of 1 to 1.03.

If the content of the vitreous binder in the dielectric powder is less than 5% by weight, sintering does not take place at 1050° C. and below. If the content of vitreous binder is not less than 40% by weight, the dielectric constant becomes less than 100.

The vitreous binder has been limited to those having a composition expressed by the general formula $$\alpha Li_2O \cdot \beta BaO \cdot \gamma B_2O_3 \cdot (1-\alpha-\beta-\gamma)SiO_2$$

wherein $0 \leq \alpha < 0.25$, $0.1 < \beta < 0.5$, $0.1 < \gamma < 0.5$, $0.3 < \alpha+\beta+\gamma < 0.8$, for the following reasons. If the mole fraction of $LiO_2$, i.e., $\alpha$, exceeds 0.25, softening of the dielectric for capacitive circuits takes place during sintering, thereby causing reaction of the dielectric with the ceramic material for the substrate or with the conductive material of the conductive pattern. If $\beta$ exceeds 0.5, sintering does not take place at a temperature of not less than 1050° C., and the dielectric constant becomes less than 100. If $\gamma$ is not more than 0.1 or not less than 0.5, sintering at 1050° C. or less is impossible. In addition, if the sum of $\alpha$, $\beta$ and $\gamma$ is not less than 0.8 or not more than 0.3, sintering does not take place at 1050° C. and below.

The vitreous binder may be contained in the paste in the form of glass frit formed by first preparing a mixture of glass forming oxides, melting the same, cooling the resultant glass, and then grinding up the glass. Alternatively, the vitreous binder may be contained in the paste in the form of a mixture of glass forming oxides.

The dielectric paste according to the present invention can be sintered at a temperature of not more than 1050° C. in a nonoxidizing atmosphere consisting essentially of $N_2$, Ar, $Co_2$, CO or $H_2$ and this makes it possible to form dielectrics for capacitive circuits with a high specific resistance of not less than $10^{12}$ Ωcm and a high dielectric constant of not less than 100.

In use, the dielectric paste is printed by thick film techniques in the designed pattern on ceramic green sheets as well as a conductive ink to be printed in the designed pattern on the green sheets, and the printed green sheets are stacked one on another and then fired in a nonoxidizing atmosphere to complete multilayer printed circuit boards containing large capacitance capacitors.

The dielectric paste of the present invention can be fired in a nonoxidizing atmosphere, thus making it possible to use a low specific resistance, inexpensive base metal such as, for example, copper, copper-base alloys and the like as a material for a conductive ink composed of conductive powder suspended in an organic vehicle.

EXAMPLE

Using $BaCO_3$, $SrCO_3$, $CaCO_3$, $MgCO_3$, $TiO_2$ and $ZrO_2$ as raw materials, there were prepared mixtures by weighing these raw materials in such proportions that each final product has a composition shown in Table 1. Each mixture was milled by the wet process in a ball mill for 16 hours, and then dried by evaporation.

The resultant mixture was then calcined at 1100° C. for 2 hours, crushed and ground to prepare calcined powder. The calcined powder was added with glass component having a composition shown in Table 1 and an organic vehicle composed of ethyl cellulose and terpinenol, and then mixed in a ball mill to prepare homogenous dielectric paste. The added amount of the glass component are also shown in Table 1.

Using the thus prepared dielectric paste, there were prepared multilayer ceramic substrates containing capacitive circuits in the following manner. The paste was screen printed in the designed pattern on a low-temperature sintering ceramic green sheet with a 200 μm thickness composed of $SiO_2$, $Al_2O_3$, $BaO$, $B_2O_3$ and an organic binder, as well as a conductive ink containing copper, to form a capacitive circuit pattern on the green sheet.

The printed green sheet was sandwiched by a pair of nonprinted ceramic green sheets, and then fired in a $N_2$ gas atmosphere at a temperature of not more than 1050° C. to form a multilayer ceramic substrate containing capacitive circuit. The capacitors formed in the substrate were electrically connected to plating on the surface of the substrate by plated through holes.

To evaluate the capacitors contained in the multilayer ceramic substrate, measurements were made on the following characteristics under the conditions mentioned below.

(1) Sintering temperature
(2) Dielectric constant and dielectric loss: measured at a frequency of 1 KHz and a temperature of 20° C.
(3) Temperature characteristics of capacitance: measured under JIS Standards in which the temperature characteristics of capacitance are defined as follows:

B Standard: The change rate of capacitance based on the capacitance at 20° C. shall not exceed −10 to +10% in the temperature range of −25° C. to +85° C.

C Standard: The change rate of capacitance based on the capacitance at 20° C. shall not exceed −20 to +20% in the temperature range of −25° C. to +85° C.

D Standard: The change rate of capacitance based on the capacitance at 20° C. shall not exceed −30 to +20% in the temperature range of −25° C. to +85° C.

(4) Specific resistance($\sigma$): A value determined from a value of the current measured by applying a DC voltage of 500 V at 20° C.

The results are shown in Table 2. In Tables 1 and 2, asterisked specimens are those beyond the scope of the present invention, while others are those falling within the scope of the present invention.

TABLE 1

| | Main component $\{(Ba_{1-x-y-z}Sr_xCa_yMg_z)O\}_m \cdot (Ti_{1-u}Zr_u)O_2$ | | | | | | Glass component $\alpha Li_2O \cdot \beta BaO \cdot YB_2O_3 \cdot (1-\alpha-\beta-Y)SiO_2$ | | | |
|---|---|---|---|---|---|---|---|---|---|---|
| No. | (wt %) | x | y | z | u | m | (wt %) | α | β | Y |
| 1 | 92 | 0 | 0 | 0 | 0 | 1.01 | 8 | 0.05 | 0.30 | 0.30 |
| 2 | " | 0.15 | 0.10 | 0.01 | 0.15 | " | " | " | " | " |
| 3 | " | 0.18 | 0.05 | 0 | 0.14 | 1.005 | " | " | " | " |
| 4* | " | 0.30 | 0.10 | 0.01 | 0.15 | 1.01 | " | " | " | " |
| 5* | " | 0.15 | 0.30 | " | " | " | " | " | " | " |
| 6* | " | " | 0.10 | 0.05 | " | " | " | " | " | " |
| 7* | " | " | " | 0.01 | 0.25 | " | " | " | " | " |
| 8* | " | " | " | " | 0.15 | 0.99 | " | " | " | " |
| 9 | " | " | " | " | " | 1.00 | " | " | " | " |
| 10 | " | " | " | " | " | 1.02 | " | " | " | " |
| 11* | " | " | " | " | " | 1.03 | " | " | " | " |
| 12* | 96 | " | " | " | " | 1.01 | 4 | " | " | " |
| 13 | 95 | " | " | " | " | " | 5 | " | " | " |
| 14 | 85 | " | " | " | " | " | 15 | " | " | " |
| 15 | 80 | " | " | " | " | " | 20 | " | " | " |
| 16* | 60 | " | " | " | " | " | 40 | " | " | " |
| 17* | 85 | " | " | " | " | " | 15 | 0.25 | 0.20 | 0.20 |
| 18* | " | " | " | " | " | " | " | 0.05 | 0.10 | 0.40 |
| 19* | " | " | " | " | " | " | " | " | 0.50 | 0.15 |
| 20* | " | " | " | " | " | " | " | " | 0.40 | 0.10 |
| 21* | " | " | " | " | " | " | " | " | 0.15 | 0.50 |
| 22* | " | " | " | " | " | " | " | 0 | " | 0.15 |
| 23* | " | " | " | " | " | " | " | 0.10 | 0.35 | 0.35 |
| 24 | " | " | " | " | " | " | " | 0 | 0.45 | 0.30 |
| 25 | " | " | " | " | " | " | " | 0.15 | 0.30 | 0.20 |

TABLE 2

| No. | Sintering temp. (°C.) | (ε) | tan δ (%) | capacitance temperature characteristic | ρ (Ω cm) |
|---|---|---|---|---|---|
| 1 | 1040 | 200 | 0.5 | B | >10$^{12}$ |
| 2 | 1020 | 1500 | 1.5 | C | " |
| 3 | " | 1800 | 1.0 | C | " |
| 4* | >1050 | — | — | — | — |
| 5* | " | — | — | — | — |
| 6* | " | — | — | — | — |

TABLE 2-continued

| No. | Sintering temp. (°C.) | ($\epsilon$) | tan δ (%) | capacitance temperature characteristic | ρ (Ω cm) |
| --- | --- | --- | --- | --- | --- |
| 7* | " | — | — | — | — |
| 8* | 1010 | — | — | — | $10^{10}$ |
| 9 | 1020 | 1600 | 1.8 | C | $>10^{12}$ |
| 10 | " | 1550 | 1.4 | C | " |
| 11* | >1050 | — | — | — | — |
| 12* | " | — | — | — | — |
| 13 | 1050 | 2100 | 1.9 | D | $>10^{12}$ |
| 14 | 950 | 1000 | 1.7 | C | " |
| 15 | 900 | 800 | 1.8 | B | " |
| 16* | 850 | 90 | " | B | " |
| 17* | <deformed by softening> | — | — | — | — |
| 18* | 1000 | 90 | 0.1 | B | $>10^{12}$ |
| 19* | >1050 | — | — | — | — |
| 20* | " | — | — | — | — |
| 21* | " | — | — | — | — |
| 22* | " | — | — | — | — |
| 23* | " | — | — | — | — |
| 24 | 1040 | 1500 | 1.2 | C | $>10^{12}$ |
| 25 | 950 | 1100 | 1.1 | B | " |

As can be seen from the results shown in Table 2, the present invention makes it possible to produce multilayer ceramic substrates containing capacitive circuits consisting of capacitors with a large capacitance, high specific resistance, and good temperature characteristics of capacitance.

What I claim is:

1. A dielectric paste comprising a dielectric powder composed of a dielectric material and a vitreous binder suspended in an organic vehicle, said dielectric material consisting essentially of a composition expressed by the general formula:

$$\{(Ba_{1-x-y-z}Sr_xCa_yMg_z)O\}_m \cdot (Ti_{1-u}Zr_u)O_2$$

wherein x, y, z, u and m take values within the following respective ranges: $0 \leq x < 0.30$, $0 \leq y < 0.30$, $0 \leq z < 0.05$, $0 \leq u < 0.25$, $1 \leq m < 1.03$, said vitreous binder consisting essentially of a composition expressed by the general formula:

$$\alpha Li_2O \cdot \beta BaO \cdot \gamma B_2O_3 \cdot (1-\alpha-\beta-\gamma)SiO_2$$

wherein α, β and γ are molar ratios of the respective ingredients and take values within the following respective ranges: $0 \leq \alpha < 0.25$, $0.1 \leq \beta < 0.5$, $0.1 < \gamma < 0.5$, $0.3 < \alpha+\beta+\gamma < 0.8$, the content of the vitreous binder in the dielectric powder being not less than 5 wt % to less than 40 wt %.

2. A dielectric paste according to claim 1 in which x is 0 to 0.15, y is 0 to 0.1, z is 0 to 0.01, u is 0 to 0.15 and m is 1 to 1.02.

3. A dielectric paste according to claim 2 in which α is 0 to 0.15, β is 0.3 to 0.45 and γ is 0.2 to 0.3.

4. A dielectric paste according to claim 3 in which the content of the vitreous binder in the dielectric powder is 5 to 20 wt %.

5. A dielectric paste according to claim 4 which has been fired in a non-oxidizing atmosphere at a temperature of not more than 1050° C.

6. A dielectric paste according to claim 5 in contact with a copper or copper alloy electrode.

7. A dielectric paste according to claim 1 which has been fired in a non-oxidizing atmosphere at a temperature of not more than 1050° C.

8. A dielectric paste according to claim 7 in contact with a copper or copper alloy electrode.

* * * * *